United States Patent
Wu et al.

(10) Patent No.: US 8,338,880 B2
(45) Date of Patent: Dec. 25, 2012

(54) FLASH MEMORY

(75) Inventors: Guan-Wei Wu, Hsinchu (TW); I-Chen Yang, Hsinchu (TW); Yao-Wen Chang, Hsinchu (TW); Tao-Cheng Lu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 219 days.

(21) Appl. No.: 12/834,228

(22) Filed: Jul. 12, 2010

(65) Prior Publication Data
US 2011/0182123 A1 Jul. 28, 2011

(30) Foreign Application Priority Data
Jan. 28, 2010 (TW) .................. 99102423 A (51) Int. Cl.
*H01L 29/66* (2006.01)
*H01L 29/788* (2006.01)
*H01L 29/792* (2006.01)
(52) U.S. Cl. .................. 257/319; 257/316; 257/324
(58) Field of Classification Search .............. 257/319
See application file for complete search history.

(56) References Cited

U.S. PATENT DOCUMENTS

| 5,350,937 | A * | 9/1994 | Yamazaki et al. | 257/316 |
|---|---|---|---|---|
| 5,633,519 | A * | 5/1997 | Yamazaki et al. | 257/315 |
| 7,304,343 | B2 * | 12/2007 | Masuoka et al. | 257/314 |
| 7,973,356 | B2 * | 7/2011 | Kikuchi | 257/324 |
| 2006/0186447 | A1 * | 8/2006 | Saitoh | 257/296 |
| 2008/0087940 | A1 * | 4/2008 | Chae et al. | 257/324 |
| 2009/0008701 | A1 * | 1/2009 | Kim et al. | 257/324 |
| 2009/0050983 | A1 * | 2/2009 | Terai | 257/411 |

* cited by examiner

*Primary Examiner* — Son Mai
(74) *Attorney, Agent, or Firm* — J.C. Patents (57) ABSTRACT

A flash memory and a manufacturing method and an operating method thereof are provided. The flash memory includes a substrate, a charge-trapping structure, a first gate, a second gate, a third gate, a first doped region and a second doped region. The substrate has a protrusion portion. The charge-trapping structure is disposed over the substrate. The first gate and the second gate are disposed respectively over the charge-trapping structure at two sides of the protrusion portion. The top surfaces of the first gate and the second gate are lower than the top surface of the charge-trapping structure located on the top of the protrusion portion. The third gate is disposed over the charge-trapping structure located on the top of the protrusion portion. The first doped region and the second doped region are disposed respectively in the substrate at two sides of the protrusion portion.

4 Claims, 8 Drawing Sheets

FLASH MEMORY

CROSS-REFERENCE TO RELATED APPLICATION

This application claims the priority benefit of Taiwan application serial no. 99102423, filed on Jan. 28, 2010. The entirety of the above-mentioned patent application is hereby incorporated by reference herein and made a part of specification.

BACKGROUND OF THE INVENTION

1. Field of the Invention

The invention relates to a flash memory and a manufacturing method and an operating method thereof, and more particularly, to a flash memory capable of avoiding a second bit effect and enhancing performance of devices, and a manufacturing method and an operating method thereof.

2. Description of Related Art

The non-volatile memory is characterized by maintaining the data stored even when the power is down, and has thus become a mandatory device in many electronic products for providing normal operation of the electronic products when booted. In particular, flash memory allows multiple data writing, reading, and erasing operations. With these advantages, flash memory has become one of the most widely adopted memory devices in personal computers and electronic equipments.

Currently, a popular flash memory such as a nitride-based flash memory. In the nitride-based flash memory, two-bit data can be stored in a charge-trapping structure with a constitution of oxide layer-nitride layer-oxide layer (that is, the conventional ONO layer). In general, two-bit data can be stored respectively on the left side (i.e. the left bit) and the right side (i.e. the right bit) of the nitride layer in the charge-trapping structure.

Nevertheless, the nitride-based flash memory has a second bit effect; that is, a reading operation performing on the left bit is affected by the right bit, or a reading operation performing on the right bit is affected by the left bit. In addition, the second bit effect becomes worsen with the gradual reduction in the sizes of memories, thereby affecting the operation window of the memories and the performance of the devices.

SUMMARY OF THE INVENTION

An embodiment of the invention is directed to a flash memory capable of avoiding a second bit effect during operation.

An embodiment of the invention is further directed to a manufacturing method of a flash memory, and the manufacturing method is capable of manufacturing a flash memory with a larger operation window.

An embodiment of the invention is further directed to an operating method of a flash memory, and the operating method is capable of enhancing performance of devices.

An embodiment of the invention is directed to a flash memory including a substrate, a charge-trapping structure, a first gate, a second gate, a third gate, a first doped region, and a second doped region. The substrate has a protrusion portion. The charge-trapping structure is disposed over the substrate. The first gate and the second gate are disposed respectively over the charge-trapping structure at two sides of the protrusion portion. Here, top surfaces of the first gate and the second gate are lower than a top surface of the charge-trapping structure located on the top of the protrusion portion. The third gate is disposed over the charge-trapping structure located on the top of the protrusion portion. The first doped region and the second doped region are disposed respectively in the substrate at the two sides of the protrusion portion.

According to the flash memory in one embodiment of the invention, the flash memory further includes a dielectric layer disposed between the first gate and the third gate, and between the second gate and the third gate.

According to the flash memory in one embodiment of the invention, the dielectric layer is made of oxide, for example.

According to the flash memory in one embodiment of the invention, the charge-trapping structure is a composite structure constituted by a bottom oxide layer, a charge-trapping layer and a top oxide layer, for instance.

According to the flash memory in one embodiment of the invention, a material of the charge-trapping layer is made of nitride or high-k material.

According to the flash memory in one embodiment of the invention, the high-k material is $HfO_2$, $TiO_2$, $ZrO_2$, $Ta_2O_5$ or $Al_2O_3$, for example.

The invention is further directed to a manufacturing method of a flash memory. In this method, a substrate is provided. Then, a portion of the substrate is removed to form a protrusion portion. Thereafter, a first doped region and a second doped region are respectively formed in the substrate at two sides of the protrusion portion. A charge-trapping structure is then formed over the substrate. A first conductive layer and a second conductive layer are formed respectively over the charge-trapping structure at the two sides of the protrusion portion. Herein, top surfaces of the first conductive layer and the second conductive layer are lower than a top surface of the charge-trapping structure located on a top of the protrusion portion. Afterwards, a third conductive layer is formed over the charge-trapping structure located on the top of the protrusion portion.

According to the manufacturing method of the flash memory in one embodiment of the invention, after the first conductive layer and the second conductive layer are formed and before the third conductive layer is formed, a dielectric layer is further formed on the first conductive layer and the second conductive layer.

According to the manufacturing method of the flash memory in one embodiment of the invention, a dielectric material layer is, for example, first formed on the substrate in a method of forming the dielectric layer. A planarization process is subsequently performed to remove a portion of the dielectric material layer until the charge-trapping structure is exposed.

According to the manufacturing method of the flash memory in one embodiment of the invention, a bottom oxide layer is, for example, first formed on the substrate in a method of forming the charge-trapping structure. A charge-trapping layer is then formed on the bottom oxide layer. Thereafter, a top oxide layer is formed on the charge-trapping layer.

According to the manufacturing method of the flash memory in one embodiment of the invention, a dielectric layer is formed on the substrate before the first doped region and the second doped region are formed, and the dielectric layer is removed after the first doped region and the second doped region are formed.

According to the manufacturing method of the flash memory in one embodiment of the invention, the first doped region and the second doped region are formed by, for example, performing an ion implantation process.

An embodiment of the invention is further directed to a flash memory including a substrate, a first gate, a second gate, a third gate, a first dielectric layer, a charge-trapping structure, a first doped region, and a second doped region. The substrate has a protrusion portion. The first gate and the second gate are disposed respectively on the substrate at two sides of the protrusion portion. The third gate is disposed over the protrusion portion. The first dielectric layer is disposed between the third gate and the protrusion portion. The charge-trapping structure is disposed between the first gate and the substrate, the first gate and the third gate, the second gate and the substrate, and the second gate and the third gate. The first doped region and the second doped region are disposed respectively in the substrate at the two sides of the protrusion portion.

According to the flash memory in one embodiment of the invention, the flash memory further includes a second dielectric layer and a conductive layer. The second dielectric layer covers the first gate, the second gate, and the third gate. The second dielectric layer has an opening exposing at least a portion of the third gate. The conductive layer is disposed in the opening.

According to the flash memory in one embodiment of the invention, the second dielectric layer is made of oxide, for example.

According to the flash memory in one embodiment of the invention, the first dielectric layer is made of oxide, for example.

Another embodiment of the invention is further directed to a manufacturing method of a flash memory. In this method, a substrate is first provided. Afterwards, a first dielectric layer and a first conductor layer are sequentially formed on the substrate. Next, a portion of each of the first conductive layer, the first dielectric layer, and the substrate are removed to form a protrusion structure. A first doped region and a second doped region are then respectively formed in the substrate at two sides of the protrusion structure. A charge-trapping structure is subsequently formed on a sidewall of the protrusion structure and on the substrate. Thereafter, a second conductive layer and a third conductive layer are formed respectively on the charge-trapping structure at the two sides of the protrusion structure.

According to the manufacturing method of the flash memory in another embodiment of the invention, the charge-trapping structure, the second conductive layer, and the third conductive layer are formed by first forming a charge-trapping material layer on the substrate and a surface of the protrusion structure. Then, a conductive material layer is formed on the substrate and covers the charge-trapping material layer. Afterwards, a planarization process is carried out to remove a portion of the conductive material layer and a portion of the charge-trapping material layer until the first conductive layer is exposed.

According to the manufacturing method of the flash memory in another embodiment of the invention, the charge-trapping structure, the second conductive layer, and the third conductive layer are formed by first forming a charge-trapping material layer on the substrate and a surface of the protrusion structure. Then, a conductive material layer is formed on the substrate and covers the charge-trapping material layer. Next, a planarization process is performed to remove a portion of the conductive material layer until the charge-trapping material layer is exposed. A second dielectric layer is then formed on the substrate and covers the first conductive layer, the second conductive layer, and the charge-trapping material layer. Subsequently, an opening is formed in the second dielectric layer and the charge-trapping material layer to expose a portion of the first conductive layer. Later, a fourth conductive layer is formed in the opening.

Another embodiment of the invention is further directed to an operating method of a flash memory. In this method, a flash memory as aforementioned is provided, and a first voltage is applied to the first gate; a second voltage is applied to the second gate; a third voltage is applied to the third gate; a fourth voltage is applied to the first doped region; a fifth voltage is applied to the second doped region; a sixth voltage is applied to the substrate when a programming operation is performed.

According to the operating method of the flash memory in another embodiment of the invention, when the programming operation is executed through, for instance, a channel hot electron (CHE) injection, the first voltage, the second voltage, and the third voltage are substantially the same. The first voltage ranges from 9 V to 13 V; the second voltage ranges from 9 V to 13 V; the third voltage ranges from 9 V to 13 V; one of the fourth voltage and the fifth voltage is 0 V while the other ranges from 3.5 V to 5.5 V; the sixth voltage is 0 V.

According to the operating method of the flash memory in one embodiment of the invention, when the programming operation is executed through, for example, a ballistic electron injection, the first voltage and the second voltage are substantially the same, and the first voltage and the second voltage are larger than the third voltage. The first voltage ranges from 9 V to 13 V; the second voltage ranges from 9 V to 13 V; the third voltage ranges from 1.5 V to 3 V; one of the fourth voltage and the fifth voltage is 0 V while the other ranges from 3.5 V to 5.5 V; the sixth voltage is 0 V.

According to the operating method of the flash memory in one embodiment of the invention, an erasing operation is further carried out after the programming operation has been performed. When the erasing operation is performed, a seventh voltage is applied to the first gate; an eighth voltage is applied to the second gate; a ninth voltage is applied to the third gate; a tenth voltage is applied to the first doped region; an eleventh voltage is applied to the second doped region; a twelfth voltage is applied to the substrate.

According to the operating method of the flash memory in one embodiment of the invention, when the erasing operation is executed through, for instance, a band-to-band hot hole (BBHH), the seventh voltage and the eighth voltage are the same, and the tenth voltage and the eleventh voltage are the same. Here, the seventh voltage and the eighth voltage range from −7 V to −9 V; the ninth voltage ranges from 3 V to 5 V; the tenth voltage and the eleventh voltage range from 4 V to 5 V; the twelfth voltage is 0 V.

According to the operating method of the flash memory in one embodiment of the invention, when the erasing operation is executed through, for instance, a Fowler-Nordheim (FN) tunneling injection, the seventh voltage, the eighth voltage, and the ninth voltage are the same, and the tenth voltage and the eleventh voltage are the same. The seventh voltage, the eighth voltage, and the ninth voltage range from −11 V to −15 V; the tenth voltage and the eleventh voltage are 0 V; the twelfth voltage is 0 V.

According to the operating method of the flash memory in one embodiment of the invention, a reading operation is performed after the programming operation has been carried out. When the reading operation is performed, a thirteenth voltage is applied to the first gate; a fourteenth voltage is applied to the second gate; a fifteenth voltage is applied to the third gate; a sixteenth voltage is applied to the first doped region; a seventeenth voltage is applied to the second doped region; an eighteenth voltage is applied to the substrate. One of the thirteenth voltage and the fourteenth voltage ranges from 3 V to 7 V while the other ranges from 8 V to 9.5 V; the fifteenth voltage ranges from 4 V to 5 V; one of the sixteenth voltage and the seventeenth voltage ranges from 1 V to 1.6 V while the other is 0 V; the eighteenth voltage is 0 V.

In light of the foregoing, the flash memory of the embodiments of the invention has two sidewall gates and a top gate located above the sidewall gates. Therefore, when the reading operation is performed, the second bit effect can be inhibited by applying high voltage to the sidewall gate located on the side not being read, so as to increase operation window. Moreover, when the programming operation is carried out, the CHE injection or the ballistic electron injection can be performed by applying suitable voltage to the two sidewall gates and the top gate to increase programming efficiency, thereby enhancing the performance of devices.

It is to be understood that both the foregoing general description and the following detailed description are exemplary, and are not intended to limit the scope of the invention.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
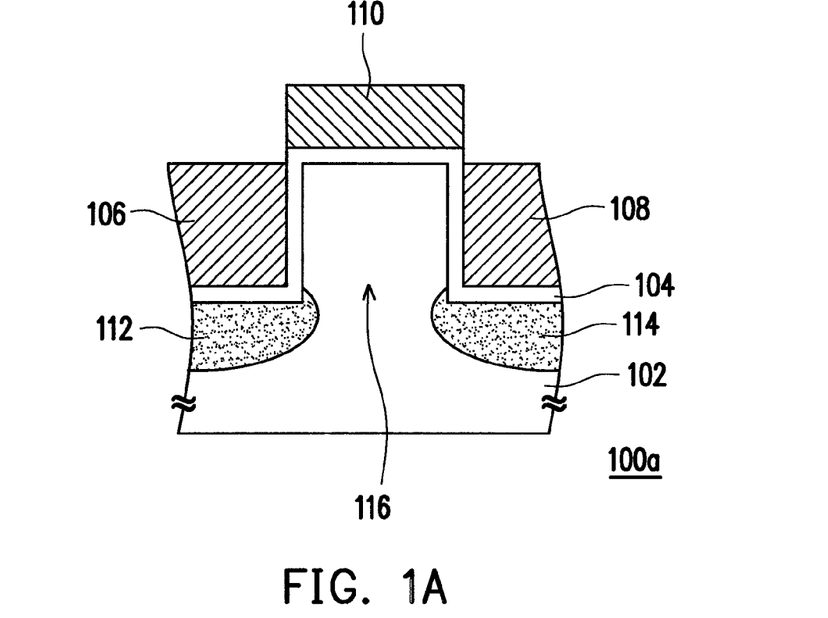
FIG. 1A illustrates a cross-sectional view of a flash memory according to an embodiment of the invention.

FIG. 1A illustrates a cross-sectional view of a flash memory according to an embodiment of the invention. Referring to FIG. 1A, a flash memory 100a includes a substrate 102, a charge-trapping structure 104, gates 106, 108, 110, and doped regions 112, 114. The substrate 102 is, for example, a silicon substrate or a silicon on insulator (SOI) substrate. The substrate 102 has a protrusion portion 116. The charge-trapping structure 104 is disposed conformally on the substrate 102. The charge-trapping structure 104, for instance, is a composite structure with a constitution of a bottom oxide layer, a charge-trapping layer, and a top oxide layer; such as, a conventional ONO structure. The bottom oxide layer is used as a tunneling dielectric layer, and the top oxide layer is used as a charge-barrier layer. A material of the charge-trapping layer may be nitride or high-k material, such as $HfO_2$, $TiO_2$, $ZrO_2$, $Ta_2O_5$ or $Al_2O_3$. The gates 106, 108 are disposed respectively on the charge-trapping structure 104 at two sides of the protrusion portion 116 as sidewall gates of the flash memory 100a. The gate 110 is disposed on the charge-trapping structure 104 located on the top of the protrusion portion 116 as a top gate of the flash memory 100a. The gates 106, 108, 110 are made of doped polysilicon, for example. It should be noted that top surfaces of the gates 106, 108 must be lower than a top surface of the charge-trapping structure 104 located on the top of the protrusion portion 116 to prevent the gates 106, 108 from contacting the gate 110. The doped regions 112, 114 are disposed respectively in the substrate 102 at the two sides of the protrusion portion 116 as a source region and a drain region of the flash memory 100a.

In another embodiment, in order to prevent the gates 106, 108 from contacting the gate 110, a dielectric layer is further disposed on the gates 106, 108.

Figure 1B:
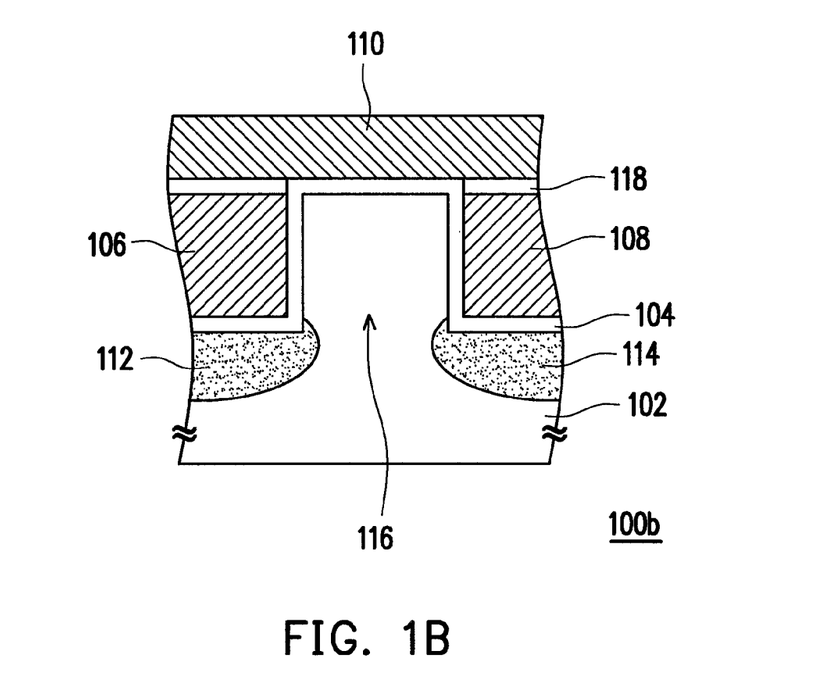
FIG. 1B illustrates a cross-sectional view of a flash memory according to another embodiment of the invention.

FIG. 1B illustrates a cross-sectional view of a flash memory according to another embodiment of the invention. In FIG. 1B, the same reference numbers are used to refer to the same parts in FIG. 1A, and the descriptions are thus omitted herein. Referring to FIG. 1B, in a flash memory 100b, a dielectric layer 118 is disposed on the gates 106, 108. The dielectric layer 118 is made of oxide, for example. In details, since the dielectric layer 118 is disposed between the gate 106 and the gate 110, and between the gate 108 and the gate 110, the gate 110 is not limited to be located only on the top of the protrusion portion 116, but can also be located on the top of the gates 106, 108. Moreover, the gate 110 is isolated from the gates 106, 108 by the dielectric layer 118. That is, the shape and size of the gate 110 are not limited in the present embodiment.

The following takes the flash memory 100b in FIG. 1B as an example to illustrate a manufacturing method of the flash memory in an embodiment of the invention.

FIGS. 2A to 2D are cross-section views showing a flowchart of manufacturing the flash memory depicted in FIG. 1B. Firstly, referring to FIG. 2A, a substrate 102 is provided. Next, a portion of the substrate 102 is removed to form a protrusion portion 116. The protrusion portion 116 is formed by, for example, first defining a mask layer on the substrate 102. The mask layer is utilized as a mask for performing an anisotropic etching process so as to remove a portion of the substrate 102. Subsequently, the mask layer is removed.

Figure 2A:
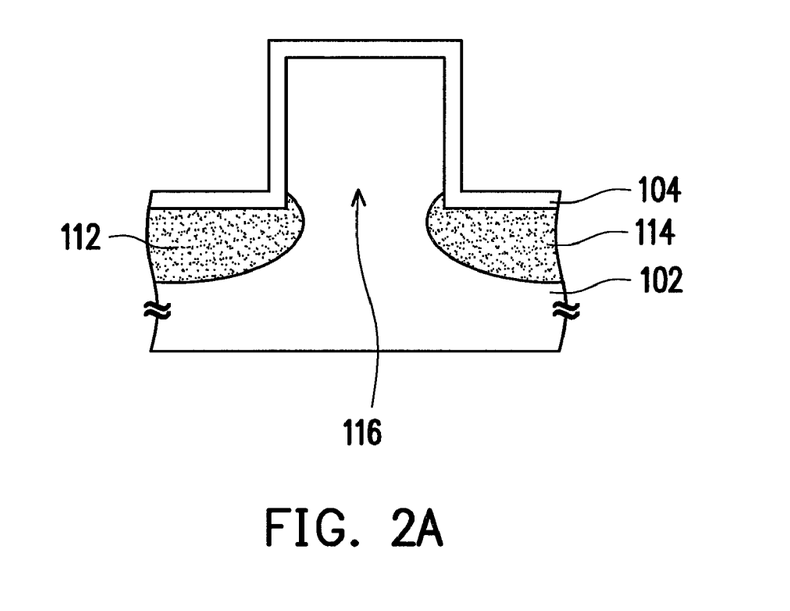
FIGS. 2A to 2D are cross-sectional views showing a flowchart of manufacturing the flash memory depicted in FIG. 1B.

Referring to FIG. 2A, doped regions 112, 114 are formed respectively in the substrate 102 at two sides of the protrusion portion 116. The doped regions 112, 114 are formed by, for example, first forming a dielectric layer (i.e. an oxide layer) conformally on the substrate 102. Next, a conventional ion implantation process is performed to implant ions into the substrate 102 at the two sides of the protrusion portion 116. Subsequently, the dielectric layer is removed. Since a dielectric layer has been formed on the substrate 102 before the ion implantation process is carried out, the substrate 102 is prevented from being damaged during the ion implantation process.

Referring to FIG. 2A, a charge-trapping structure 104 is formed on the substrate 102. The charge-trapping structure 104 is formed by first performing a thermal oxidation process or a chemical vapor deposition (CVD) process, for example, so as to form a bottom oxide layer on the substrate 102. Thereafter, the CVD process is carried out to form a charge-trapping layer on the bottom oxide layer. The CVD process is performed again to form a top oxide layer on the charge-trapping layer.

Figure 2B:
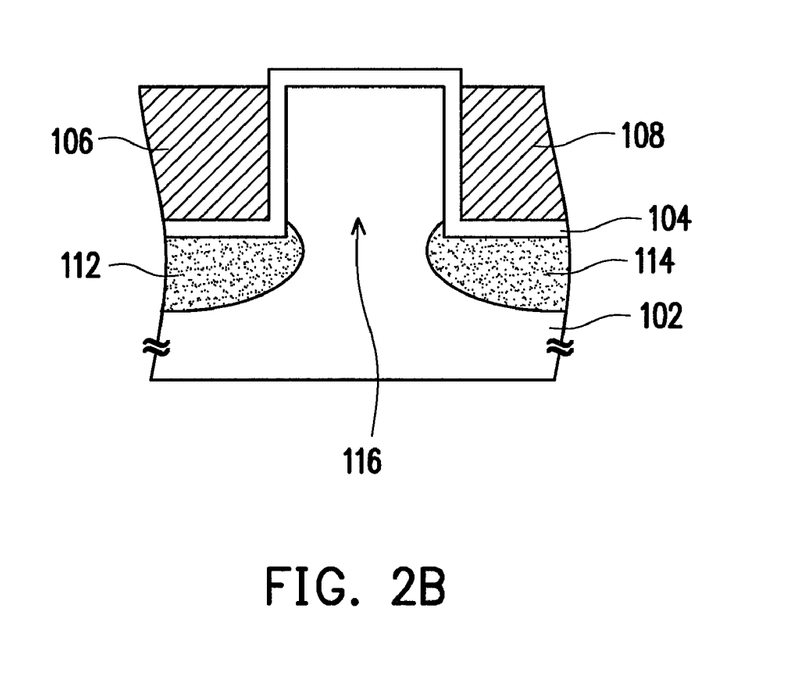

Referring to FIG. 2B, a first conductive layer (that is, the gate 106) and a second conductive layer (that is, the gate 108) are formed respectively on the charge-trapping structure 104 at the two sides of the protrusion portion 116. Herein, top surfaces of the first conductive layer and the second conductive layer are lower than a top surface of the charge-trapping structure 104 located on the top of the protrusion portion 116. The first conductive layer and the second conductive layer are formed by first forming a conductive material layer on the substrate 102, for instance. A planarization process is then performed to remove a portion of the conductive material layer until the charge-trapping structure 104 is exposed. Afterwards, an etch-back process is performed to remove a portion of the conductive material layer.

Figure 2C:
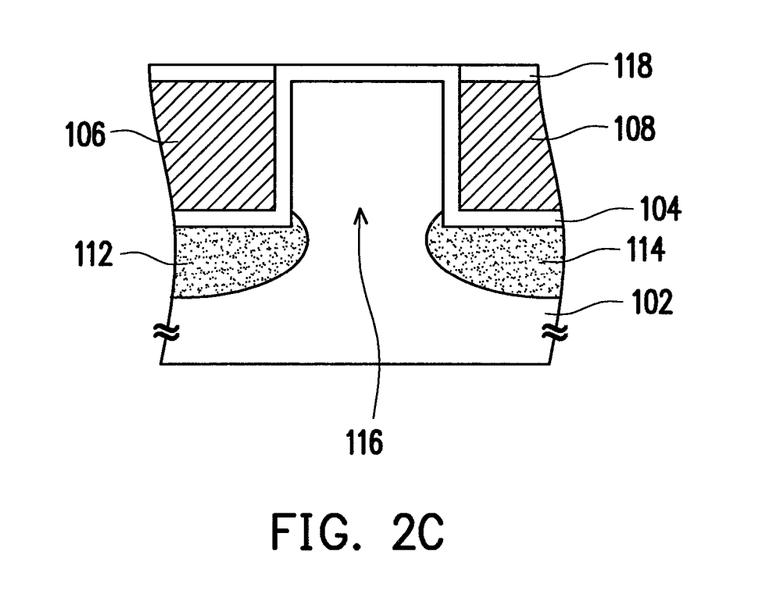

Referring to FIG. 2C, a dielectric layer 118 is formed on the first conductive layer and the second conductive layer. The dielectric layer 118 is formed by first forming a dielectric material layer on the substrate 102, for instance. A planarization process is subsequently performed to remove a portion of the dielectric material layer until the charge-trapping structure 104 is exposed.

Figure 2D:
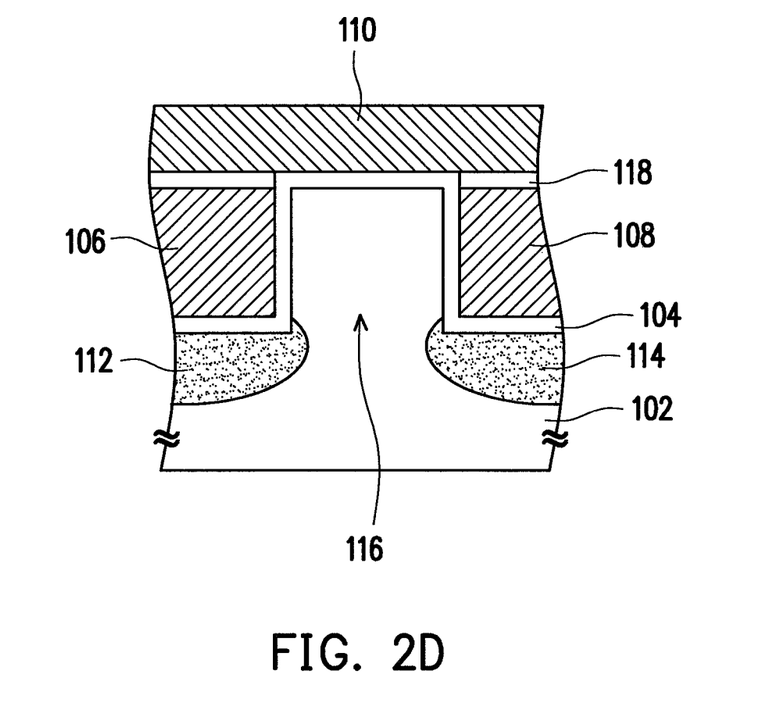

Referring to FIG. 2D, a third conductive layer (that is, the gate 110) is formed on the dielectric layer 118 and the charge-trapping structure 104 so as to form the flash memory 100b.

It should be noted that when the gate 110 has to be formed only on the charge-trapping structure 104 located on the top of the protrusion portion 116 (as shown in FIG. 1A), the step of forming the dielectric layer 118 as illustrated in FIG. 2C can be omitted optionally depending on actual demands. Consequently, the gate 110 is formed on the charge-trapping structure 104 located on the top of the protrusion portion 116 directly after the formation of the gates 106, 108.

The following takes the flash memory 100b in FIG. 1B as an example to illustrate an operating method of the flash memory in the invention.

Figure 3A:
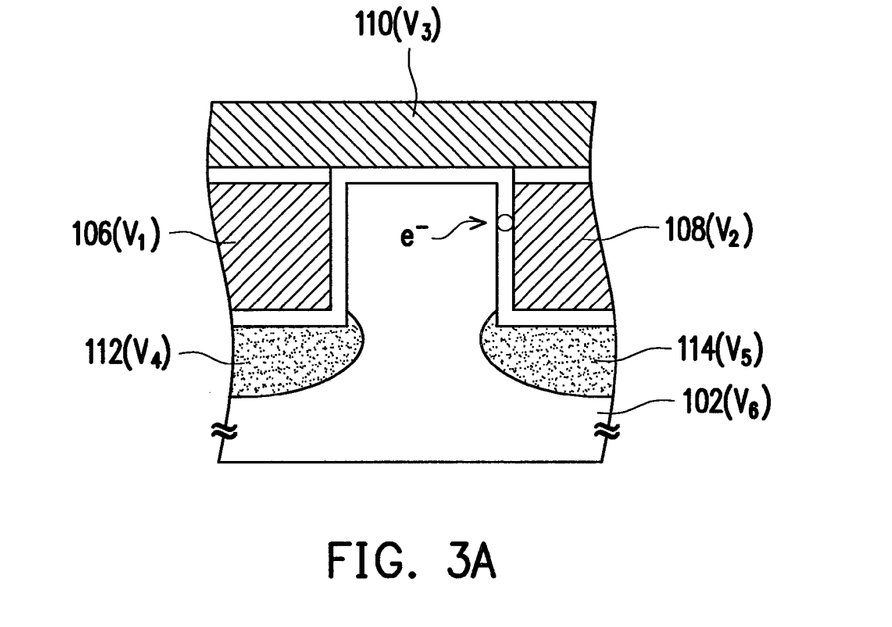
FIG. 3A schematically illustrates a programming operation of a flash memory according to an embodiment of the invention.

FIG. 3A schematically illustrates a programming operation of a flash memory according to an embodiment of the invention. Referring to FIG. 3A, when a programming operation is performed to the flash memory 100b, a voltage $V_1$ is applied to the gate 106; a voltage $V_2$ is applied to the gate 108; a voltage $V_3$ is applied to the gate 110; a voltage $V_4$ is applied to the doped region 112; a voltage $V_5$ is applied to the doped region 114; a voltage $V_6$ is applied to the substrate 102. In details, when the programming operation is executed to the right bit of the flash memory 100b through the CHE injection (that is, storing electrons into the charge-trapping structure 104 on the right side), the voltages $V_1$, $V_2$, $V_3$ are high voltages that are substantially the same and range, for example, from 9 V to 13 V, so that all of vertical channels and horizontal channels are strongly turned-on; voltage $V_4$ is 0 V, for instance; voltage $V_5$ ranges from 3.5 V to 5.5 V, for example; voltage $V_6$ is 0 V, for example. Thus, electrons are accelerated in the vertical channels on the right side, so as to be injected into the charge-trapping structure 104 on the right side. Similarly, when the programming operation is executed to the left bit of the flash memory 100b through the CHE injection (that is, storing electrons into the charge-trapping structure 104 on the left side), the voltages $V_1$, $V_2$, $V_3$ are high voltages that are substantially the same and range, for example, from 9 V to 13 V, so that all of vertical channels and horizontal channels are strongly turned-on; voltage $V_4$ ranges from 3.5 V to 5.5 V, for instance; voltage $V_5$ is 0 V, for example; voltage $V_6$ is 0 V, for example. Thus, electrons are accelerated in the vertical channels on the left side, so as to be injected into the charge-trapping structure 104 on the left side.

Additionally, when the programming operation is executed to the right bit of the flash memory 100b through the ballistic electron injection, the voltages $V_1$, $V_2$ are high voltages that are substantially the same, and are larger than the voltage $V_3$ which has a relatively low voltage. Here, the voltages $V_1$, $V_2$ range, for example, from 9 V to 13 V, so that the vertical channels are strongly turned-on. On the other hand, the voltage $V_3$ ranges from 1.5 V to 3 V, for instance, such that the horizontal channels are weakly turned-on; voltage $V_4$ is 0 V, for example; voltage $V_5$ ranges from 3.5 V to 5.5 V, for instance; voltage $V_6$ is 0 V, for example. Therefore, the accelerated electrons are injected into the charge-trapping structure 104 on the right side without energy loss. Consequently, the programming operation becomes more efficient. Also, when the programming operation is executed to the left bit of the flash memory 100b through the ballistic electron injection, the voltages $V_1$, $V_2$ are high voltages that are substantially the same, and are larger than the voltage $V_3$ which has a relatively low voltage. Here, the voltages $V_1$, $V_2$ range, for example, from 9 V to 13 V, so that the vertical channels are strongly turned-on. On the other hand, the voltage $V_3$ ranges from 1.5 V to 3 V, for instance, such that the horizontal channels are weakly turned-on; voltage $V_4$ ranges from 3.5 V to 5.5 V to 5.5 V, for instance; voltage $V_5$ is 0 V, for example; voltage $V_6$ is 0 V, for example. Thus, the accelerated electrons are injected into the charge-trapping structure 104 on the left side without energy loss. Consequently, the programming operation becomes more efficient.

Furthermore, after the aforementioned programming operation, an erasing operation is then performed to the data stored in the flash memory 100b.

Figure 3B:
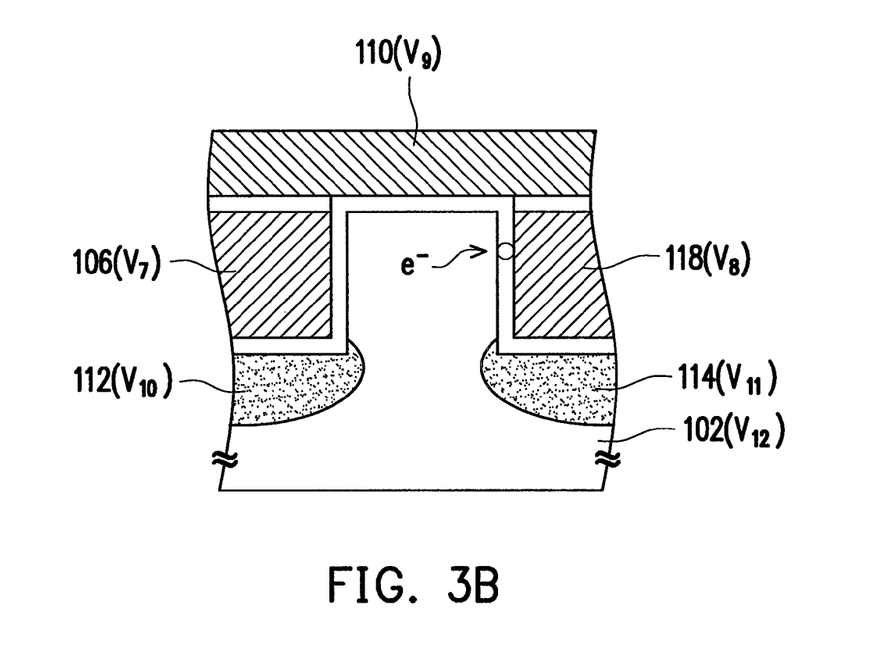
FIG. 3B schematically illustrates an erasing operation of a flash memory according to an embodiment of the invention.

FIG. 3B schematically illustrates an erasing operation of a flash memory according to an embodiment of the invention. Referring to FIG. 3B, when an erasing operation is performed to the programmed flash memory 100b, a voltage $V_7$ is applied to the gate 106; a voltage $V_8$ is applied to the gate 108; a voltage $V_9$ is applied to the gate 110; a voltage $V_{10}$ is applied to the doped region 112; a voltage $V_{11}$ is applied to the doped region 114; a voltage $V_{12}$ is applied to the substrate 102.

Specifically, when the erasing operation is performed to the programmed flash memory 100b through the BBHH, since the erasing operation is performed to the left bit and the right bit simultaneously, the same voltages are applied to the gates 106, 108 and the same voltages are applied to the doped regions 112, 114. That is, the voltage $V_7$ and the voltage $V_8$ are the same and range from −7 V to −9 V, for example; the voltage $V_{10}$ and the voltage $V_{11}$ are the same and range from 4 V to 5 V, for instance. In addition, the voltage $V_9$ ranges from 3 V to 5 V, for example; the voltage $V_{12}$ is 0 V, for example. As a consequence, holes are injected into the charge-trapping structure 104 stored with electrons for recombining with electrons so as to erase the data stored in the flash memory 100b.

Further, when the erasing operation is performed to the programmed flash memory 100b through the FN tunneling injection, the same voltages are applied to the gates 106, 108, 110 and the same voltages are applied to the doped regions 112, 114. That is, the voltages $V_7$, $V_8$, $V_9$ are the same and range from −11 V to −15 V, for example; the voltage $V_{10}$ and the voltage $V_{11}$ are the same and are 0 V, for instance. The voltage $V_{12}$ is 0 V, for example. As a consequence, electrons are ejected from the charge-trapping structure 104 so as to erase the data stored in the flash memory 100b.

Furthermore, after the aforementioned programming operation, a reading operation is then performed to the data stored in the flash memory 100b.

Figure 3C:
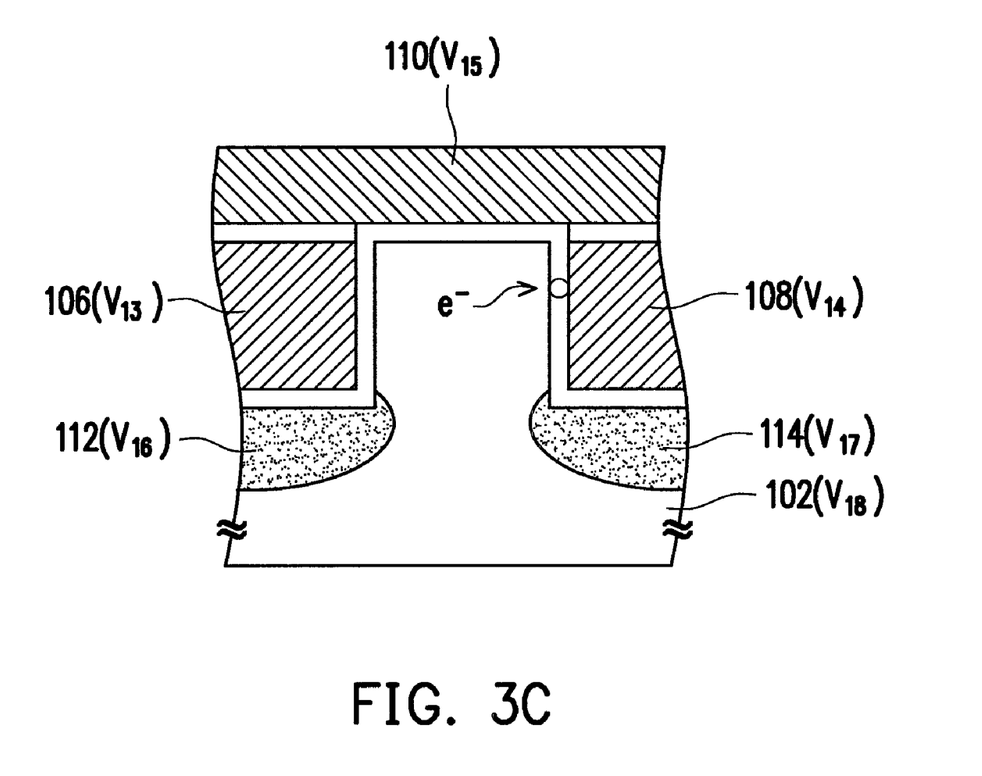
FIG. 3C schematically illustrates a reading operation of a flash memory according to an embodiment of the invention.

FIG. 3C schematically illustrates a reading operation of a flash memory according to an embodiment of the invention. Referring to FIG. 3C, when a reading operation is performed to the programmed flash memory 100b, a voltage $V_{13}$ is applied to the gate 106; a voltage $V_{14}$ is applied to the gate 108; a voltage $V_{15}$ is applied to the gate 110; a voltage $V_{16}$ is applied to the doped region 112; a voltage $V_{17}$ is applied to the doped region 114; a voltage $V_{18}$ is applied to the substrate 102.

When the reading operation is performed to the right bit, the voltage $V_{13}$ ranges from 8 V to 9.5 V, for example; the voltage $V_{14}$ ranges from 3 V to 7 V, for example; the voltage $V_{15}$ ranges from 4 V to 5 V, for instance; one of the voltage $V_{16}$ and the voltage $V_{17}$ ranges from 1 V to 1.6 V, for instance, while the other is 0 V, for example; the voltage $V_{18}$ is 0 V, for instance. When the data stored in the right bit is being read, the gate 106 in the left bit is applied with a high voltage, the second bit effect is therefore inhibited and the operation window is consequently increased. Similarly, when the reading operation is performed to the left bit, the voltage $V_{13}$ ranges from 3 V to 7 V, for example; the voltage $V_{14}$ ranges from 8 V to 9.5 V, for example; the voltage $V_{15}$ ranges from 4 V to 5 V, for instance; one of the voltage $V_{16}$ and the voltage $V_{17}$ ranges from 1 V to 1.6 V, for instance, while the other is 0 V, for example; the voltage $V_{18}$ is 0 V, for instance. When the data stored in the left bit is being read, the gate 108 in the right bit is applied with a high voltage, the second bit effect is therefore inhibited and the operation window is consequently increased.

The flash memory of the invention not only includes the structure having three gates as shown in FIGS. 1A and 1B, but can also have a structure in other forms, where the structure includes three gates.

Figure 4A:
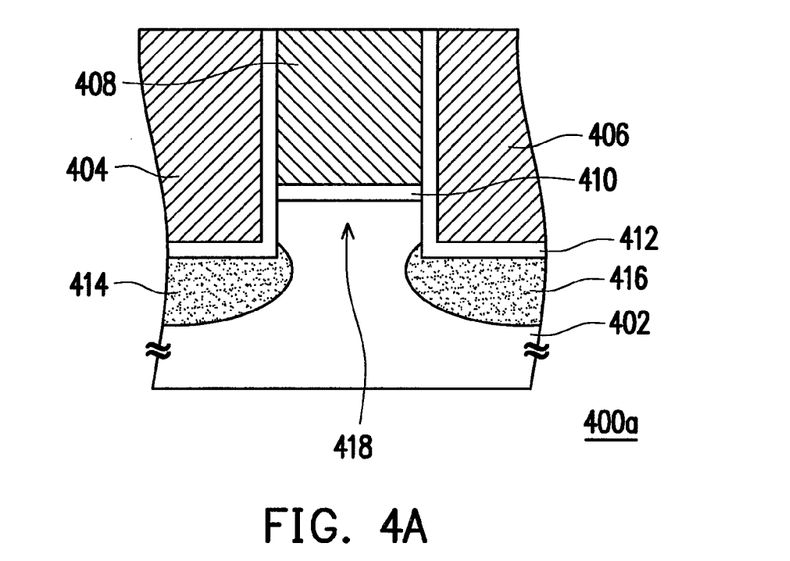
FIG. 4A illustrates a cross-sectional view of a flash memory according to another embodiment of the invention.

FIG. 4A illustrates a cross-sectional view of a flash memory according to another embodiment of the invention. Referring to FIG. 4A, a flash memory 400a includes a substrate 402, gates 404, 406, 408, a dielectric layer 410, a charge-trapping structure 412, and doped regions 414, 416. The substrate 402 includes, for example, a silicon substrate or a silicon on insulator (SOI) substrate. The substrate 402 has a protrusion portion 418. The gates 404, 406 are disposed respectively on the substrate 402 at two sides of the protrusion portion 418 as sidewall gates of the flash memory 400a. The gate 408 is disposed on the protrusion portion 418 as a top gate of the flash memory 400a. The gates 404, 406, 408 are made of doped polysilicon, for example. The dielectric layer 410 is disposed between the gate 408 and the protrusion portion 418 as a gate insulating layer. The dielectric layer 410 is made of oxide, for example. The charge-trapping structure 412 is disposed between the gate 404 and the substrate 402, the gate 404 and the gate 408, the gate 406 and the substrate 402, and the gate 406 and the gate 408. The charge-trapping structure 412, for instance, is a composite structure with a constitution of a bottom oxide layer, a charge-trapping layer, and a top oxide layer; such as a conventional ONO structure. The bottom oxide layer is used as a tunneling dielectric layer, and the top oxide layer is used as a charge-barrier layer. The doped regions 414, 416 are disposed respectively in the substrate 402 at the two sides of the protrusion portion 418 as a source region and a drain region of the flash memory 400a.

It should be noted that in one embodiment of the present embodiment, top surfaces of the gates 404, 406, 408 are on the same horizontal level. However, in other embodiments, as long as the gates 404, 406, 408 do not contact one another, the top surfaces of the gates 404, 406, 408 may not be on the same horizontal level depending on actual requirements.

Figure 4B:
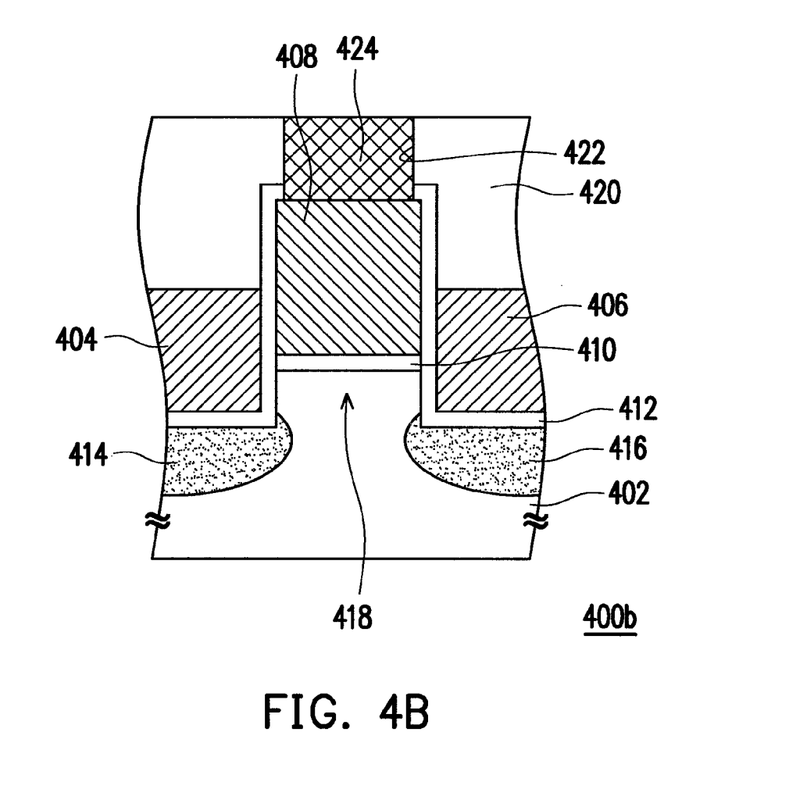
FIG. 4B illustrates a cross-sectional view of a flash memory according to an embodiment of the invention.

FIG. 4B illustrates a cross-sectional view of a flash memory according to an embodiment of the invention. In FIG. 4B, the same reference numbers are used to refer to the same parts in FIG. 4A, and the descriptions are thus omitted herein. Referring to FIG. 4B, the dielectric layer 420 covers the gates 404, 406, 408 in a flash memory 400b. The dielectric layer 420 and the charge-trapping structure 412 have an opening 422 exposing at least a portion of the gate 408. Moreover, a conductive layer 424 is disposed in the opening 422 to be electrically connected with the gate 408. In other words, the conductive layer 424 is utilized as a contact, so that the gate 408 can be electrically connected to an external circuit through the dielectric layer 420. The conductive layer 424 is made of, for example, doped polysilicon. In the present embodiment, the top surfaces of the gates 404, 406 are lower than the top surface of the gate 408. Obviously, in other embodiments, as long as the gates 404, 406, 408 do not contact one another, the top surfaces of the gates 404, 406 can be higher than the top surface of the gate 408, or the top surfaces of the gates 404, 406, 408 can be on the same horizontal level.

The following takes the flash memory 400b in FIG. 4B as an example to illustrate a manufacturing method of the flash memory in an embodiment of the invention.

FIGS. 5A to 5D are cross-sectional views showing a flow-chart of manufacturing the flash memory depicted in FIG. 4B. Firstly, referring to FIG. 5A, a substrate 402 is provided. Next, a dielectric layer (not shown) and a conductive layer (not shown) are sequentially formed on the substrate 402. The dielectric layer is formed by performing a thermal oxidation process, for example. The conductive layer is formed by, for example, performing a CVD process. Next, a portion of each of the conductive layer, the dielectric layer, and the substrate 402 are removed to form a protrusion structure (including a protrusion portion 418, and a dielectric layer 410 and the gate 408 located thereon). A portion of each of the conductive layer, the dielectric layer, and the substrate 402 is removed by, for example, first defining a mask layer on the substrate 402. The mask layer is utilized as a mask for performing an anisotropic etching process so as to remove a portion of each of the conductive layer, the dielectric layer, and the substrate 402. Subsequently, the mask layer is removed.

Figure 5A:
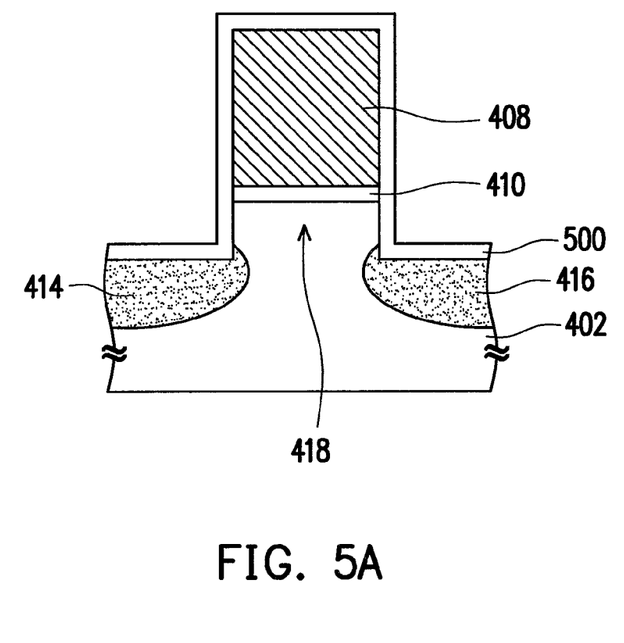
FIGS. 5A to 5D are cross-sectional views showing a flowchart of manufacturing the flash memory depicted in FIG. 4B.

Referring to FIG. 5A, doped regions 414, 416 are formed respectively in the substrate 402 at two sides of the protrusion structure. The doped regions 414, 416 are formed by, for example, first forming a dielectric layer (i.e. an oxide layer) conformally on the substrate 402. Next, a conventional ion implantation process is performed to implant ions into the substrate 402 at the two sides of the protrusion structure. Afterwards, the dielectric layer is removed. Since a dielectric layer has been formed on the substrate 402 before the ion implantation process is carried out, the substrate 402 is prevented from being damaged during the ion implantation process.

Referring to FIG. 5A, a charge-trapping material layer 500 is formed on sidewalls of the protrusion structure and on the substrate 402. The charge-trapping material layer 500 is formed by first performing a CVD process, for example, so as to form a bottom oxide layer on the substrate 402 and a surface of the protrusion structure. Thereafter, the CVD process is carried out to form a charge-trapping layer on the bottom oxide layer. The CVD process is performed again to form a top oxide layer on the charge-trapping layer.

Figure 5B:
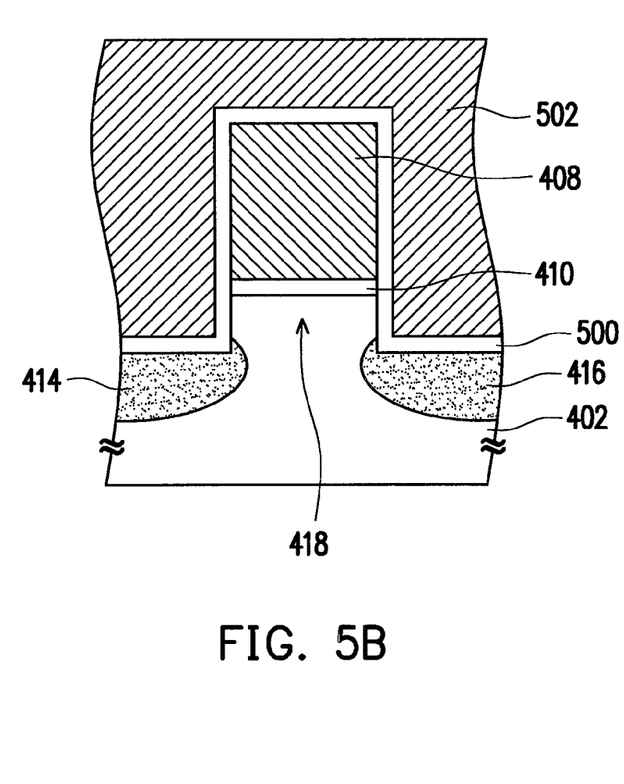

Referring to FIG. 5B, a conductive material layer 502 is formed on the substrate 402 and covers the charge-trapping material layer 500. The conductive material layer 502 is made of, for example, doped polysilicon and is formed by, for example, a CVD process.

Figure 5C:
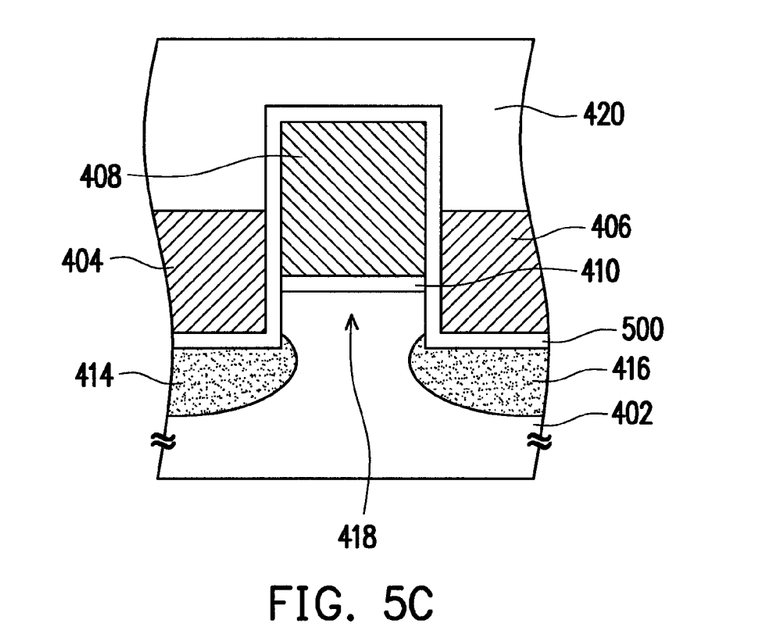

Referring to FIG. 5C, a planarization process is performed to remove a portion of the conductive material layer 502 until the charge-trapping material layer 500 is exposed. After the planarization process, an etch-back process is performed to remove a portion of the conductive material layer 502 so as to form the gates 404, 406, such that top surfaces of the gates 404, 406 are lower than a top surface of the gate 408. A dielectric layer 420 is formed on the substrate 402 and covers the gates 404, 406 and the charge-trapping material layer 500. The dielectric layer 420 is formed by, for example, a CVD process.

Figure 5D:
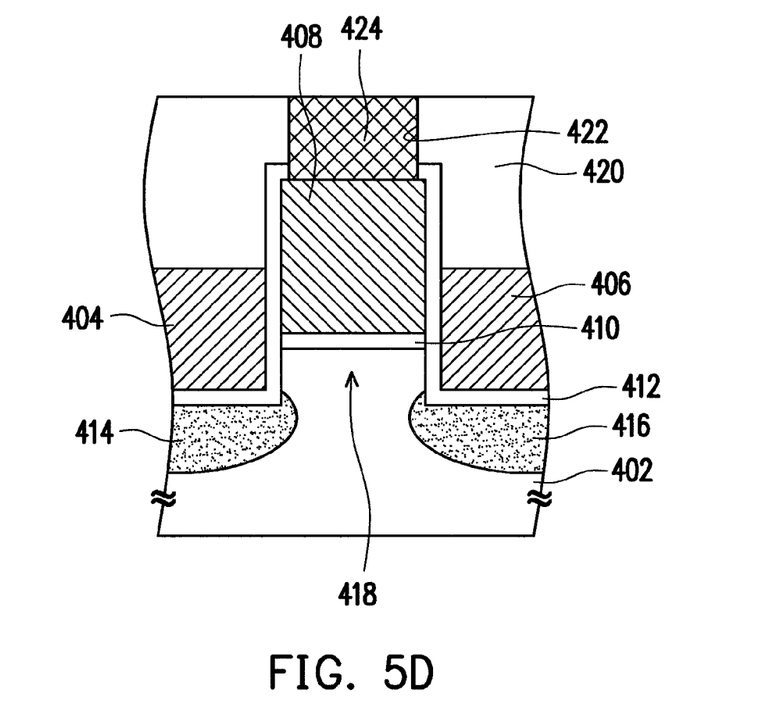

Referring to FIG. 5D, an opening 422 is formed in the dielectric layer 420 and the charge-trapping material layer 500 so as to expose a portion of the gate 408 and form a charge-trapping structure 412 simultaneously. The opening 422 is formed by, for example, performing a photolithographic process and an etching process sequentially to remove a portion of each of the dielectric layer 420 and the charge-trapping material layer 500. Thereafter, a conductor layer 424 is formed in the opening 422. The conductive layer 424 is formed by first forming a conductive material layer on the dielectric layer 420 and filling the opening 422, for instance. A planarization process is then performed to remove the conductive material layer outside the opening 422.

It should be noted that in order to form the structure shown in FIG. 4A, a planarization process is performed directly after the step illustrated in FIG. 5B (after the formation of the conductive material layer 502) to remove a portion of the conductive material layer 502 and a portion of the charge-trapping material layer 500 until the gate 408 is exposed. Thus, the steps depicted in FIGS. 5C to 5D are then omitted.

The operating methods of the flash memory 400a in FIG. 4A and the flash memory 400b in FIG. 4B are identical to the operating method of the flash memory 100b in FIG. 1B. That is, when the programming operation is performed to the flash memories 400a, 400b, the voltage $V_1$, the voltage $V_2$, the voltage $V_3$, the voltage $V_4$, the voltage $V_5$, and the voltage $V_6$ are applied to the gate 404, the gate 406, the gate 408, the doped region 414, the doped region 416, and the substrate 402 respectively; when the erasing operation is performed to the flash memories 400a, 400b, the voltage $V_7$, the voltage $V_8$, the voltage $V_9$, the voltage $V_{10}$, the voltage $V_{11}$, and the voltage $V_{12}$ are applied to the gate 404, the gate 406, the gate 408, the doped region 414, the doped region 416, and the substrate 402 respectively; when the reading operation is performed to the flash memories 400a, 400b, the voltage $V_{13}$, the voltage $V_{14}$, the voltage $V_{15}$, the voltage $V_{16}$, the voltage $V_{17}$, and the voltage $V_{18}$ are applied to the gate 404, the gate 406, the gate 408, the doped region 414, the doped region 416, and the substrate 402 respectively.

In summary, the flash memory of the embodiments of the invention has two sidewall gates and a top gate located above the sidewall gates. Therefore, when the data stored in the flash memory are read, the second bit effect can be inhibited by applying high voltage to the sidewall gate located on the side not being read, so as to increase operation window.

Furthermore, when the programming operation is carried out to the flash memory of the embodiments of the invention, the CHE injection or the ballistic electron injection can be performed by applying suitable voltage to the two sidewall gates and the top gate to increase programming efficiency, thereby enhancing the performance of devices.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A flash memory, comprising:
 a substrate, having a protrusion portion;
 a charge-trapping structure, disposed over the substrate;
 a first gate and a second gate, disposed respectively over the charge-trapping structure at two sides of the protrusion portion, wherein a top surface of each of the first gate and the second gate are lower than a top surface of the charge-trapping structure located on a top of the protrusion portion;
 a third gate, disposed over the charge-trapping structure located on the top of the protrusion portion; and
 a first doped region and a second doped region, disposed respectively in the substrate at two sides of the protrusion portion.

2. The flash memory as claimed in claim 1, further comprising a dielectric layer disposed between the first gate and the third gate, and between the second gate and the third gate.

3. A flash memory, comprising:
 a substrate, having a protrusion portion;
 a first gate and a second gate, disposed respectively on the substrate at two sides of the protrusion portion;
 a third gate, disposed over the protrusion portion;
 a first dielectric layer, disposed between the third gate and the protrusion portion;
 a charge-trapping structure, disposed between the first gate and the substrate, the first gate and the third gate, the second gate and the substrate, and the second gate and the third gate; and
 a first doped region and a second doped region, disposed respectively in the substrate at the two sides of the protrusion portion.

4. The flash memory as claimed in claim 3, further comprising:
 a second dielectric layer, covering the first gate, the second gate, and the third gate, wherein the second dielectric layer has an opening exposing at least a portion of the third gate; and
 a conductive layer, disposed in the opening.

* * * * *